(12) United States Patent
Yuksel et al.

(10) Patent No.: US 11,198,807 B2
(45) Date of Patent: Dec. 14, 2021

(54) THERMAL INTERFACE MATERIALS WITH RADIATIVE COUPLING HEAT TRANSFER

(71) Applicant: International Business Machines Corporation, Armonk, NY (US)

(72) Inventors: Anil Yuksel, Austin, TX (US); Mark K. Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 16/578,703

(22) Filed: Sep. 23, 2019

(65) Prior Publication Data
US 2021/0087450 A1  Mar. 25, 2021

(51) Int. Cl.
*H01L 23/373* (2006.01)
*C09K 5/14* (2006.01)

(52) U.S. Cl.
CPC ............. *C09K 5/14* (2013.01); *H01L 23/3733* (2013.01)

(58) Field of Classification Search
CPC .................. H01L 23/3733; H01L 23/3737
See application file for complete search history.

(56) References Cited

U.S. PATENT DOCUMENTS

| | | |
|---|---|---|
| 5,586,011 A | 12/1996 | Alexander |
| 8,129,001 B2 | 3/2012 | Wang et al. |
| 8,900,704 B1* | 12/2014 | Zinn .................. H01L 23/3736 428/402 |
| 9,190,342 B2 | 11/2015 | Paolella et al. |
| 9,362,242 B2 | 6/2016 | Iwata et al. |
| 9,551,839 B2 | 1/2017 | Rollinger |
| 10,266,740 B2 | 4/2019 | Han et al. |
| 2005/0045855 A1* | 3/2005 | Tonapi ................ H01L 23/3737 252/500 |

(Continued)

OTHER PUBLICATIONS

Zhao et al., "Synthesis and properties of copper conductive adhesives modified by SiO2 nanoparticles," Institute of Nuclear and New Energy Technology, Tsinghua University, Beijing 100084, China, Accepted Mar. 15, 2006, Available online Sep. 11, 2006, 5 pages.

(Continued)

*Primary Examiner* — Jaehwan Oh
(74) *Attorney, Agent, or Firm* — Rachel M. Yadlosky

(57) ABSTRACT

A thermal interface material, a process of forming a thermal interface, the thermal interface including the thermal interface material, and an article of manufacture including the thermal interface material, where the thermal interface material includes polar nanoparticles embedded in one or more carrier materials. The polar nanoparticles may have a diameter of approximately 50-60 nanometers or less, and near-field radiative coupling between the polar nanoparticles. The process of forming the thermal interface including: obtaining the polar nanoparticles; adding the polar nanoparticles to one or more carrier materials to form a carrier mixture, where the polar nanoparticles are embedded in the one or more carrier materials; creating a thermal interface material using the carrier mixture; applying the thermal interface material to a first electronics component and a second electronics component; and compressing the electronics components, where the compressing densely packing the polar nanoparticles.

20 Claims, 4 Drawing Sheets

(56) References Cited

U.S. PATENT DOCUMENTS

| | | | | |
|---|---|---|---|---|
| 2007/0131897 | A1* | 6/2007 | Cheng | H01L 23/3737 252/70 |
| 2010/0157538 | A1* | 6/2010 | Wang | H01L 23/3737 361/704 |
| 2010/0302739 | A1* | 12/2010 | Wang | H01L 23/3737 361/713 |
| 2012/0289637 | A1* | 11/2012 | Du | C08K 3/36 524/379 |
| 2013/0156938 | A1* | 6/2013 | Geddes | G01N 21/64 427/8 |
| 2014/0197387 | A1* | 7/2014 | Miyao | C08J 5/005 257/40 |
| 2014/0243189 | A1* | 8/2014 | Yin | B82Y 30/00 502/158 |
| 2015/0197660 | A1* | 7/2015 | Ronne | C08J 3/09 524/432 |
| 2015/0344776 | A1* | 12/2015 | Bootman | C09K 11/02 252/301.36 |
| 2016/0282017 | A1* | 9/2016 | Besbes | F24S 90/00 |
| 2017/0022628 | A1* | 1/2017 | Breen | G02B 6/0023 |
| 2018/0014780 | A1* | 1/2018 | Sotzing | A61B 5/291 |
| 2018/0133346 | A1* | 5/2018 | Wiesner | A61K 49/0093 |
| 2018/0229299 | A1* | 8/2018 | Crane | B01J 35/023 |
| 2018/0353433 | A1* | 12/2018 | Tuteja | A61K 9/5042 |
| 2019/0181069 | A1* | 6/2019 | Rykaczewski | H01L 24/32 |
| 2019/0233608 | A1* | 8/2019 | Yao | B05D 1/26 |
| 2019/0241804 | A1* | 8/2019 | Aboulaich | C09K 11/08 |
| 2021/0015410 | A1* | 1/2021 | Grant | G01N 21/6428 |

OTHER PUBLICATIONS

Yuksel et al., "Thermo-Optical Properties of Packed Nanoparticle Thermal Interface Materials," 16th IEEE ITHERM Conference, 2017, 3 pages, https://ieeexplore.ieee.org/stamp/stamp.jsp?arnumber=7992467.

Yuksel et al., "Thermal cooling of high-power electronics using SiO2 nanoparticle packings," 2017 FCMN, 3 pages, https://www.nist.gov/sites/default/files/documents/2017/04/04/038.pdf.

Yuksel, "Design, characterization and optimization of high-efficiency Thermophotovoltaic (TPV) device using near-field thermal energy conversion," Thesis, University of Texas at Austin, Dec. 2013, 100 pages.

* cited by examiner

THERMAL INTERFACE MATERIALS WITH RADIATIVE COUPLING HEAT TRANSFER

BACKGROUND

The present disclosure relates to thermal interface materials and, more specifically, to thermal interface materials with polar nanoparticles that enhance thermal transport and decrease contact resistance between particle layers.

A thermal interface material is a material(s) that is inserted between two components, typically electronic components, in order to enhance the thermal coupling between the two components. Thermal interface materials may be used for heat dissipation, for example. For instance, thermal interface materials may be used to create a bridge between high power electronic components and a cooling mechanism to dissipate the heat effectively. When thermal interface materials are used for heat dissipation, the thermal interface material(s) may be inserted between a heat-processing device (e.g., an integrated circuit) and a heat-dissipating device (e.g., a heat sink).

SUMMARY

Various embodiments are directed toward a thermal interface material, the thermal interface material including polar nanoparticles embedded in one or more carrier materials. The polar nanoparticles may have a nominal diameter of approximately 50-60 nanometers or less. The polar nanoparticles may also have near-field radiative coupling between the polar nanoparticles.

Additional embodiments are directed toward a process of forming a thermal interface. The process may include obtaining polar nanoparticles having a nominal diameter of 50-60 nm or less and near-field radiative coupling between the polar nanoparticles. The process may also include adding the polar nanoparticles to one or more carrier materials to form a carrier mixture, where the polar nanoparticles are embedded in the one or more carrier materials. The process may also include creating a thermal interface material using the carrier mixture. The method may also include applying the thermal interface material between a first electronics component and a second electronics component. The method may also include compressing the first electronics component and the second electronics component, where the compressing densely packs the polar nanoparticles.

Additional embodiments are directed to an article of manufacture including a thermal interface material, the thermal interface material including polar nanoparticles embedded in one or more carrier materials. The polar nanoparticles may have a diameter of approximately 50-60 nanometers or less. The polar nanoparticles may also have near-field radiative coupling between the polar nanoparticles.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
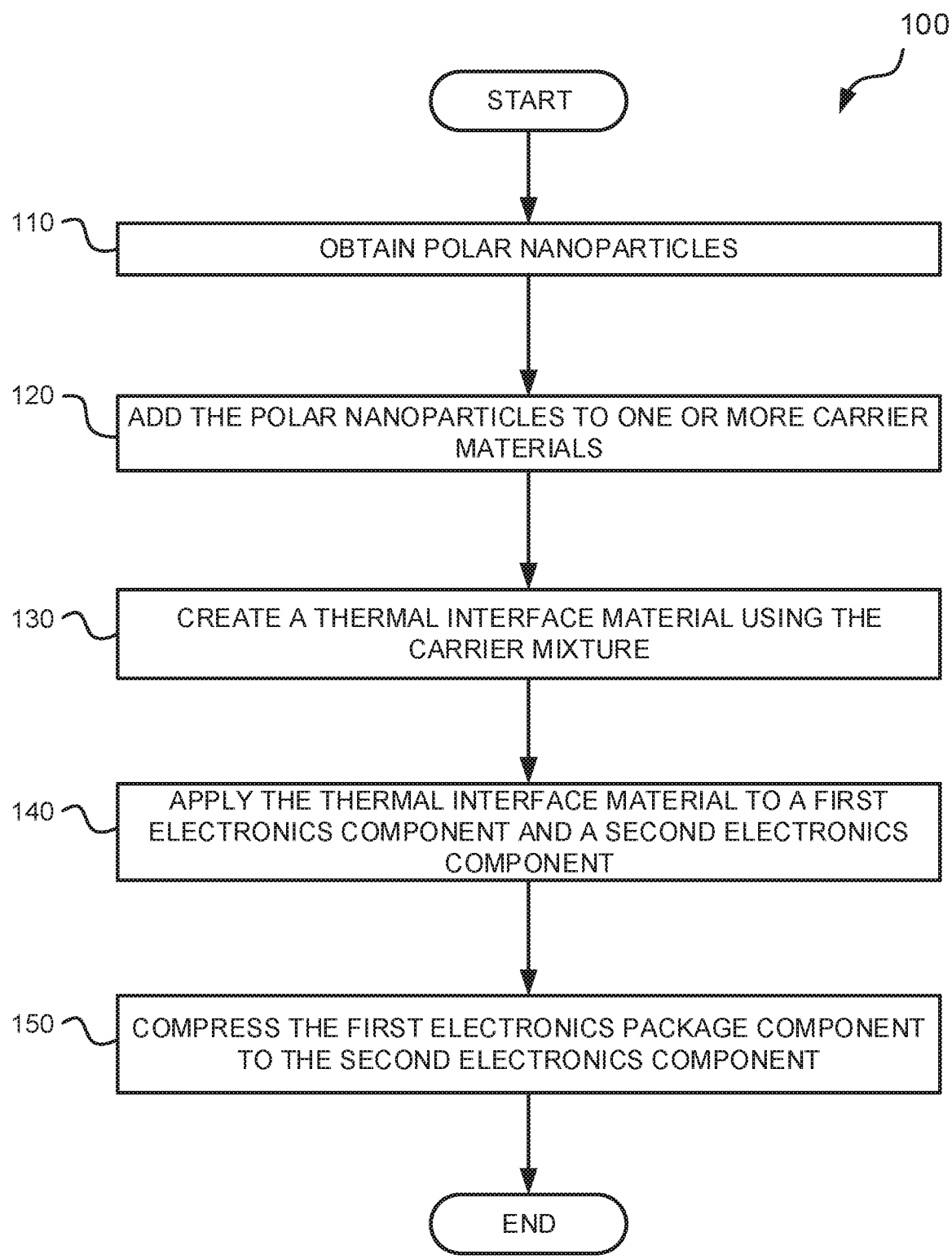
FIG. 1 depicts a flowchart of a set of operations for forming a thermal interface, according to some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present disclosure relates to thermal interface materials and, more specifically, to thermal interface materials with polar nanoparticles that enhance thermal transport and decrease contact resistance between particle layers. While the present disclosure is not necessarily limited to such applications, various aspects of the disclosure may be appreciated through a discussion of various examples using this context.

Developing high-performance thermal interface materials (TIMs) is one of the main difficulties associated with effective electronics cooling. Without high-performance TIMs, effective cooling may not be possible. At the microscopic level, surface roughness at the interface between materials/components may lead to poor contact and air gaps in between the components, which may decrease the effective thermal conductivity between the components and may cause a high thermal contact resistance. TIMs may be used between components, for example in an electronics package, to fill the gaps and lower the thermal contact resistance. Conventional TIMs may include metal solders, epoxies, and thermal greases, but these materials may not have low thermal resistance reliability, temperature tolerance, and mechanical softness in order to compensate for thermal expansion that is required for high-power electronics. Therefore, even with the use of conventional TIMs, high thermal resistance may be achieved within the high-power electronics packaging.

The present disclosure provides a thermal interface material, a process of forming a thermal interface that includes the thermal interface material, and an article of manufacture that includes the thermal interface material. In the article of manufacture, the thermal interface material may include polar nanoparticles embedded in one or more carrier materials. The polar nanoparticles may have a diameter of about 50-60 nanometers (nm), or less, and may have near-field radiative coupling between the nanoparticles. Near-field may refer to a region of an electromagnetic field around an object. Coupling may refer to the transfer of energy from one nanoparticle to another nanoparticle. Therefore, near-field radiative coupling may be radiative heat transfer in the near-field. The near-field radiative coupling may enhance thermal transport and decrease contact resistance between particle layers. As such, packed polar nanoparticles with the radiative coupling effects may be embedded in various carrier materials (e.g., polymer oils, polymer matrices, etc.)

to form TIMs, and these TIMs may offer high-thermal-performance cooling of electronics due to the polar nanoparticles.

For example, packed beds of silicon dioxide ($SiO_2$) particles may exhibit anomalously high thermal conductivities, which may be caused by the near-field radiative coupling between particles. The near-field radiative coupling between particles may be due to the nanoparticles' ability to support, or achieve, surface phonon polaritons (SPhPs), which are collective oscillations of charge that give rise to very high electric fields around the particles. Nanoparticles that remain stable in a carrier material at high temperatures (such as $SiO_2$ particles) may be mechanically pliable. The pliability (which may reduce air gaps and improve contact between components) in combination with the stability at high temperatures may lead to TIMs that achieve high thermal conductivity and high thermal performance.

Referring now to FIG. 1, a flowchart of a process 100 for forming a thermal interface is depicted, according to some embodiments. The thermal interface may include a TIM (or TIMs) that achieves high thermal conductivity and high thermal performance, in some embodiments. Process 100 begins with operation 110 to obtain polar nanoparticles. The polar nanoparticles may have a diameter of approximately 50-60 nm or less. In some embodiments, approximately 50-60 nm may include diameters up to 70 and/or 75 nm. Polar nanoparticles of approximately 50-60 nm (or smaller) may exhibit high thermal conductivities. Certain polar nanoparticles outside of this size range may not have high thermal conductivities and therefore may not perform well within a TIM, particularly for high-power electronics. In some embodiments, the polar nanoparticles are tightly packed. Tightly packing the nanoparticles may cause less space between the nanoparticles, which may result in a higher thermal conductivity.

The polar nanoparticles may also have near-field radiative coupling between the polar nanoparticles, in some embodiments. Near-field and far-field may refer to regions of an electromagnetic field around an object. For instance, near-field may be closer to the object and far-field may be farther away from the object. Coupling may refer to the transfer of energy from one nanoparticle to another. The near-field radiative coupling between the polar nanoparticles may significantly enhance thermal transport and may decrease contact resistance within the thermal interface. Therefore, using the polar nanoparticles with near-field radiative coupling may provide a TIM that can be used for high-performance heat transfer (i.e., the ability to transfer a high amount of heat per unit of time or per unit of surface area), that may be needed, for example, to cool high-power electronics.

In some embodiments, the polar nanoparticles support, or achieve, surface phonon polaritons (SPhPs). SPhPs, as used herein, refer to collective oscillations of charge that give rise to very high electric fields around the particles. When the polar nanoparticles support SPhPs, the near-field radiative coupling may take the form of surface phonon polariton coupling (SPhP coupling). The SPhP coupling may enhance thermal transport over macroscopic length scales, which may more effectively dissipate the heat (i.e., increase the efficiency of heat transfer) from electronics such as high-power electronics.

In some embodiments, the polar nanoparticles are $SiO_2$ nanoparticles. As discussed herein, packed beds of $SiO_2$ nanoparticles may exhibit anomalously high thermal conductivities that may be caused by near-field radiative coupling between the nanoparticles. This may be due to the $SiO_2$ nanoparticles' ability to support SPhPs. Further, $SiO_2$ is stable at high temperatures, which may help result in high thermal performance of the TIMs and the thermal interface.

Process 100 continues with operation 120 to add the polar nanoparticles to one or more carrier materials. Adding the polar nanoparticles to one or more carrier materials may form a carrier mixture. The carrier mixture may be a paste or grease. In some embodiments, the carrier mixture includes the polar nanoparticles embedded in the one or more carrier materials. Carrier materials, as used herein, may refer to gap-fillers that help fill in the gaps between the polar nanoparticles. In some embodiments, the carrier materials may include polymer oils, polymer matrices, low melting point waxes, and/or organic polymers. For example, a carrier material may take the form of silicone oils, glycerol, propylene glycol, mineral oils, essential oils, synthetic oils, vacuum pump fluids, vacuum pump contact lubricants, hydrocarbon based waxes, etc.

In some instances, a mixture of carrier materials are used in order to optimize radiative coupling performance. These carrier mixtures may be miscible or immiscible in one another. To optimize radiative coupling performance, the carrier mixture may be tuned to improve thermo-optical performance. When the carrier mixtures are miscible, direct carrier mixture tuning may be enabled through the miscibility. When the mixtures are immiscible, tuning may be performed by driving an averaging effect on the refractive indices. In some embodiments, the one or more carrier materials are blended to further tune refractive index. Refractive indices are further discussed herein.

In some embodiments, the carrier material itself may be tuned. For instance, a single carrier material may be used, instead of a carrier mixture, and the single carrier material may be tuned to improve or optimize radiative coupling performance. Tuning the carrier materials may include tuning a dielectric constant of the carrier materials. In some embodiments, the dielectric constant of the one or more carrier materials (referred to herein as a carrier dielectric constant) is tuned to enhance transmission of filler particle generated SPhPs. The carrier dielectric constant may be the ratio of the permittivity of the carrier material to the permittivity of free space (i.e., vacuum). Tuning the carrier dielectric constant may include changing the spacing of the nanoparticles within the carrier materials. Changing the spacing of the particles may change the permittivity of the carrier material, which may therefore change the dielectric constant.

In some embodiments, the dielectric constant of the carrier material may be tuned to have similar dielectric properties to the polar nanoparticles. The dielectric properties of carrier materials may be determined in general by examining their optical properties. Specifically, the refractive indices (TO) of the nanoparticles and the carrier materials may be examined. Refractive index/indices may refer to the ratio of the speed of light in a vacuum and the velocity of light within a medium (e.g., the carrier material). Minimal deterioration of radiative coupling between particles is realized with closer index of refraction matching between the nanoparticles and the carrier materials. This may increase and/or enhance the radiative coupling effects even further. Similar refractive indices of the nanoparticles and the carrier materials may result in similar dielectric constants.

Process 100 continues with operation 130 to create a thermal interface material using the carrier mixture. In some embodiments, the carrier mixture may be the TIM. In some embodiments, creating the TIM may include densely packing the polar nanoparticles within the carrier mixture such that there is minimal to no space between the polar nanoparticles.

In some embodiments, a polar nanoparticle (e.g., a $SiO_2$ nanoparticle) filled TIM may include carrier materials with a refractive index in the range of about 1.35 to 3.0. If possible, the carrier materials may also possess an imaginary part of the refractive index (e.g., k, or the dielectric loss property) in the range of 0.02-0.09. In some embodiments, the refractive index of the carrier materials is between 1.4-1.6, in order to enhance radiative coupling between the nanoparticles in the TIM. Example carrier materials and their corresponding refractive index include: polydimethylsiloxane (PDMS; $\eta$=1.41), ethylene glycol ($\eta$=1.43), poly a olefin oil (PAO oil; $\eta$=1.45), olive oil ($\eta$=1.46), vegetable oil ($\eta$=1.47), glycerin ($\eta$=1.47), silicone oil ($\eta$=1.52), cedarwood oil ($\eta$=1.52), methyl salicylate (wintergreen oil; $\eta$=1.54), ethyl cinnamate (cinnamon oil, $\eta$=1.56), polyphenyl ether (PPE; $\eta$=1.63), etc.

In some embodiments, the refractive index of carrier materials changes as a function of temperature. Therefore, suitable carrier materials may include various oils and low-melting-temperature waxes.

In some embodiments, the carrier material may have adequate chemical and overall temperature stability for use in TIMs, and may have an inherent propensity to wet the nanoparticle surfaces. Wetting the nanoparticle surfaces may provide for closely packed particle gap filling, and may increase surface particle coating to eliminate air gaps that may degrade coupling efficiency.

Process 100 continues with operation 140, which applies the thermal interface material to a first electronics component and a second electronics component. The first electronics component may be a surface of an electronics system (e.g., high-power electronics) that needs to be cooled. In some embodiments, the TIM is applied to a first electronics component using application methods such as dispensing, screen printing, stenciling, etc. In some embodiments, the TIM is applied between the first electronics component and the second electronics component.

In some embodiments, when oil-based carriers are used (e.g., mineral oils, silicone oils, essential oils, high temperature oils, etc.) in the TIM, a cross-linking agent may be added to the oil based carrier and/or the TIM in order to create a TIM gel. The TIM gel may be applied to the first electronics component via various methods (discussed herein). In some embodiments, the TIM gel is applied to the first electronics component and then is followed by a thermal cure in order to cure the TIM gel. In some embodiments, the TIM gel is pre-cured and is then processed into an elastomeric pad format. The TIM in the elastomeric pad format may be applied to the first electronics component in a solid form (for example, using prescribed component dimensions).

Process 100 continues with operation 150 to compress the first electronics component to a second electronics component. In some embodiments, compressing the first electronics component to the second electronics component may include compressing the first electronics component and the second electronics component together. In some embodiments, load is added to one or both of the electronics components to compress them together. Once the TIM is applied to the first electronics component, the first electronics component may be compressed to the second electronics component in order to form a thermal interface. In some embodiments, the first electronics component and the second electronics component are surfaces that need to be cooled. Compressing the two components may densely or tightly pack the polar nanoparticles (of a select size of approx. 50-60 nm) and may result in nanoparticles that exhibit anomalously high thermal conductivity driven by near-field radiative coupling between the nanoparticles (discussed herein). In some embodiments, particles that are in contact with the other particles may be considered tightly packed. For example, each particle may be touching each surrounding particle at its widest point (i.e., the diameter).

In some instances, the first electronics component and the second electronics component are part of a high-power dissipated system, light-emitting diodes (LEDs), data centers, high heat flux systems, etc. These types of systems may have higher heats, in some embodiments, so they may need a TIM that has a high thermal performance, therefore effectively cooling the system(s).

Figure 2:
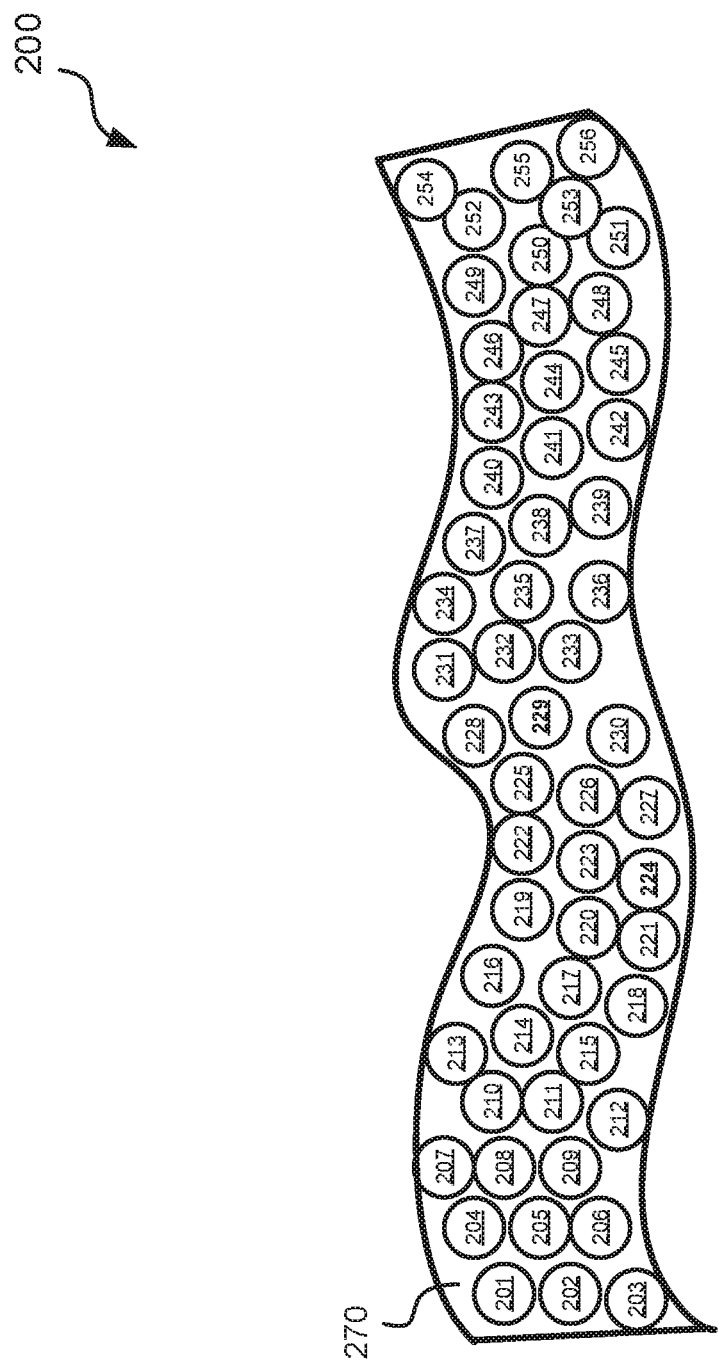
FIG. 2 depicts a schematic diagram of a thermal interface material, according to some embodiments.

Referring to FIG. 2, a schematic diagram of a thermal interface material 200 is depicted, according to some embodiments. The thermal interface material 200 includes a carrier material 270 and polar nanoparticles 201-256. In some embodiments, polar nanoparticles 201-256 have a diameter of approximately 60-70 nm or less and have near-field radiative coupling between the polar nanoparticles 201-256. In some embodiments, the diameter may be up to approximately 65 nm. The polar nanoparticles 201-256 may be tightly, or, in other words, densely, packed in order to increase the thermal conductivity. The polar nanoparticles 201-256, may be so densely packed that there are minimal to no spaces between each nanoparticle, in some instances. In some embodiments, the thermal interface material 200 may have a paste-like consistency and may be pliable, or flexible, in order to fill in gaps between components of electronics (e.g., high power electronics). In some embodiments, thermal interface material 200 has a gel-like consistency. In some embodiments, thermal interface material 200 may be in a pad (i.e., solid-like) format.

Figure 3:
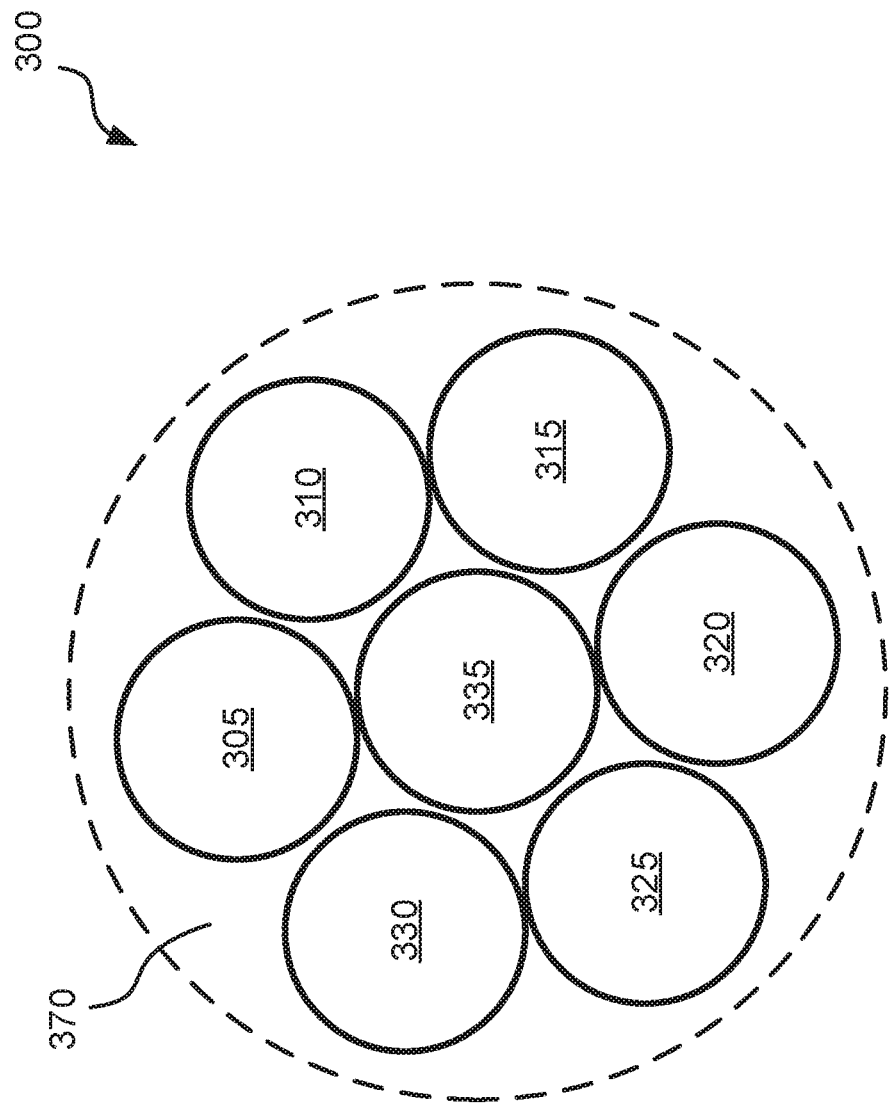
FIG. 3 depicts a schematic diagram of a cross-section of a thermal interface material, according to some embodiments.

Referring now to FIG. 3, a schematic diagram of a cross-section 300 of a thermal interface material is depicted, according to some embodiments. In some embodiments cross-section 300 is a cross section of thermal interface material 200 (FIG. 2). Cross-section 300 includes polar nanoparticles 305-335 and carrier material 370. In some embodiments, polar nanoparticles 305-335 correspond to side views of spherical polar nanoparticles 201-256 (FIG. 2). Because nanoparticles 305-335 are tightly, or densely, packed, they may form a honeycomb-like cross-section of the thermal interface material.

In some embodiments, carrier material 370 corresponds to carrier material 270 (FIG. 2). The carrier material 370 may fill in the gaps between each polar nanoparticle 305-335. In some embodiments, cross-section 300 is just a portion of a cross-section of a thermal interface material.

Figure 4:
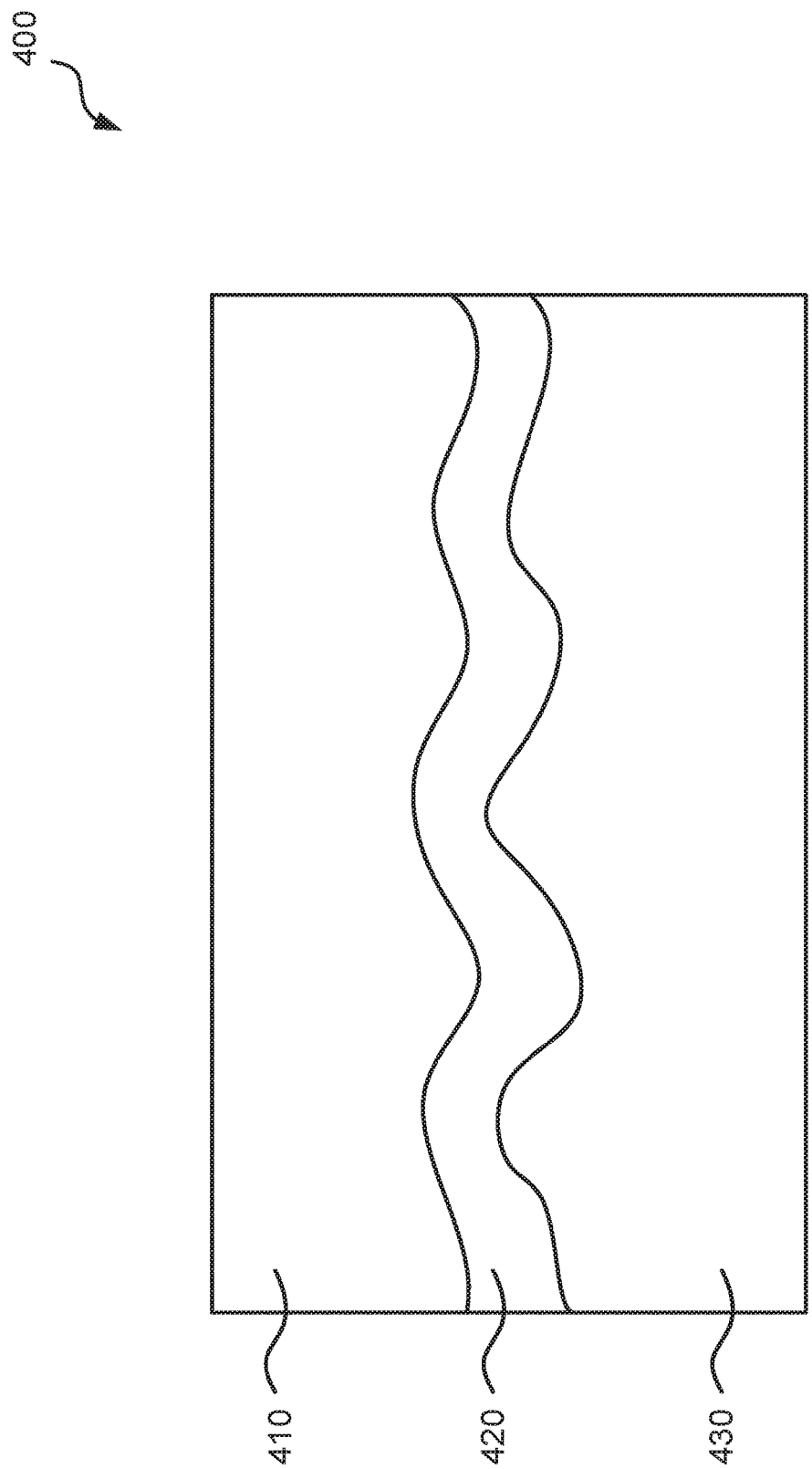
FIG. 4 depicts a schematic diagram of a thermal interface, according to some embodiments.

Referring to FIG. 4, a schematic diagram of a thermal interface 400 is depicted, according to some embodiments. Thermal interface 400 includes a first component 410 (e.g., an electronics component), a second component 430, and a thermal interface material (TIM) 420 to fill in the gaps between the two components (410 and 430). In some embodiments, TIM 420 corresponds to TIM 200 (FIG. 2). Cross-section 300 (FIG. 3) may be a cross-section, or a portion of a cross-section, of TIM 420. In some embodiments, thermal interface 400 is part of a high-power electronics system. The TIM 420 may be inserted in order to dissipate heat from, or cool down, the high-power electronics system. In some embodiments, the first electronics component 410 may be a heat-processing device (e.g., an integrated circuit) and the second electronics component 430 may be a heat-dissipating device (e.g., a heat sink), or vice versa. Inserting TIM 420 between the two devices may help cool down a high-power electronics system.

In some embodiments, thermal interface 400 is formed using process 100 (FIG. 1).

The processes discussed herein and their accompanying drawings are not to be construed as limiting. One skilled in the art would recognize that a variety of reaction conditions can optionally be changed over the course of a process. Further, in some embodiments, processes can be added or omitted while still remaining within the scope of the disclosure, as will be understood by a person of ordinary skill in the art.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A thermal interface material comprising:
    polar nanoparticles embedded in one or more carrier materials, wherein the polar nanoparticles have:
        a diameter of approximately 50-60 nanometers or less; and
        near-field radiative coupling between the polar nanoparticles.

2. The thermal interface material of claim 1, wherein:
    the polar nanoparticles support surface phonon polaritons; and
    the near-field radiative coupling is surface phonon polariton coupling.

3. The thermal interface material of claim 2, wherein a carrier dielectric constant of the one or more carrier materials is tuned for generation of the surface phonon polaritons.

4. The thermal interface material of claim 2, wherein the carrier dielectric constant has similar dielectric properties to the polar nanoparticles.

5. The thermal interface material of claim 1, wherein the polar nanoparticles are $SiO_2$ nanoparticles.

6. The thermal interface material of claim 1, wherein the polar nanoparticles are tightly packed in the one or more carrier materials.

7. The thermal interface material of claim 1, wherein the one or more carrier materials comprise at least one of:
    polymer oils, polymer matrices, low melting point waxes, and organic polymers.

8. The thermal interface material of claim 1, wherein the one or more carrier materials have a refractive index between 1.35 to 3.0.

9. The thermal interface material of claim 8, wherein the one or more carrier materials have a refractive index between 1.4 to 1.6.

10. The thermal interface material of claim 1, wherein the one or more carrier materials comprise at least one of: silicone oil, glycerol, propylene glycol, mineral oils, essential oils, synthetic oils, vacuum pump fluids, vacuum pump contact lubricants, and hydrocarbon based waxes.

11. A process of forming a thermal interface, the process comprising:
    obtaining polar nanoparticles having a diameter of approximately 50-60 nanometers or less and near-field radiative coupling between the polar nanoparticles;
    adding the polar nanoparticles to one or more carrier materials to form a carrier mixture, wherein the polar nanoparticles are embedded in the one or more carrier materials;
    creating a thermal interface material using the carrier mixture;
    applying the thermal interface material to a first electronics component and a second electronics component; and
    compressing the first electronics component and the second electronics component, wherein the compressing densely packs the polar nanoparticles.

12. The process of claim 11, wherein:
    the polar nanoparticles support surface phonon polaritons; and
    the near-field radiative coupling is surface phonon polariton coupling.

13. The process of claim 11, wherein the polar nanoparticles are $SiO_2$ nanoparticles.

14. The process of claim 11, wherein an application method for the applying the thermal interface material is selected from a group consisting of dispense, screen printing, and stenciling.

15. The process of claim 11, wherein the one or more carrier materials comprise at least one of:
    polymer oils, polymer matrices, low melting point waxes, and organic polymers.

16. The process of claim 15, wherein the one or more carrier materials comprise at least the polymer oil, further comprising:
    adding a cross-linking agent to the polymer oil.

17. The process of claim 11, wherein the first electronics component and the second electronics component are part of at least one of:
    a high-power dissipated system, LEDs, data centers, and high heat flux systems.

18. An article of manufacture comprising a thermal interface material, the thermal interface material comprising:
    polar nanoparticles embedded in one or more carrier materials, wherein the polar nanoparticles have:
        a diameter of approximately 50-60 nanometers or less; and
        near-field radiative coupling between the polar nanoparticles.

19. The article of manufacture of claim 18, wherein:
    the polar nanoparticles support surface phonon polaritons; and
    the near-field radiative coupling is surface phonon polariton coupling.

20. The article of manufacture of claim 18, wherein the polar nanoparticles are $SiO_2$ nanoparticles.

* * * * *